United States Patent
Jürgensen et al.

(10) Patent No.: US 7,078,318 B2
(45) Date of Patent: Jul. 18, 2006

(54) METHOD FOR DEPOSITING III-V SEMICONDUCTOR LAYERS ON A NON-III-V SUBSTRATE

(75) Inventors: Holger Jürgensen, Aachen (DE); Alois Krost, Berlin (DE); Armin Dadgar, Berlin (DE)

(73) Assignee: Aixtron AG (DE)

( * ) Notice: Subject to any disclaimer, the term of this patent is extended or adjusted under 35 U.S.C. 154(b) by 170 days.

(21) Appl. No.: 10/872,905

(22) Filed: Jun. 21, 2004

(65) Prior Publication Data

US 2005/0026392 A1 Feb. 3, 2005

Related U.S. Application Data

(63) Continuation of application No. PCT/EP02/12869, filed on Nov. 16, 2002.

(51) Int. Cl.
 H01L 21/30 (2006.01)
 H01L 21/20 (2006.01)

(52) U.S. Cl. .................... 438/456; 438/478
(58) Field of Classification Search ............ 438/455, 438/458, 459, 478, 933
See application file for complete search history.

(56) References Cited

U.S. PATENT DOCUMENTS

| | | | | |
|---|---|---|---|---|
| 4,891,329 A | * | 1/1990 | Reisman et al. ......... | 438/459 |
| 5,268,327 A | * | 12/1993 | Vernon ..................... | 117/89 |
| 5,966,622 A | * | 10/1999 | Levine et al. ............ | 438/459 |
| 6,139,628 A | * | 10/2000 | Yuri et al. ................ | 117/89 |
| 6,191,006 B1 | * | 2/2001 | Mori ......................... | 438/455 |
| 6,242,324 B1 | | 6/2001 | Kub et al. ................ | 438/455 |
| 6,303,405 B1 | | 10/2001 | Yoshida et al. .......... | 438/46 |
| 6,376,866 B1 | * | 4/2002 | Shakuda ................... | 257/103 |
| 2001/0009134 A1 | | 7/2001 | Kim et al. ................ | 117/8 |

FOREIGN PATENT DOCUMENTS

| | | |
|---|---|---|
| EP | 0 377 940 B1 | 9/1989 |
| EP | 0 468 814 B1 | 9/1994 |
| WO | WO 00/33364 | 6/2000 |
| WO | WO 01/43174 A3 | 6/2001 |
| WO | WO 01/93325 A1 | 12/2001 |
| WO | WO 01/95380 A1 | 12/2001 |

OTHER PUBLICATIONS

International Search Report, Jan. 28, 2004.

* cited by examiner

*Primary Examiner*—Michael Lebentritt
*Assistant Examiner*—Scott B. Geyer
(74) *Attorney, Agent, or Firm*—St. Onge Steward Johnston & Reens LLC

(57) ABSTRACT

The invention relates to a method for depositing thick III-V semiconductor layers on a non-III-V substrate, particularly a silicon substrate, by introducing gaseous starting materials into the process chamber of a reactor. The aim of the invention is to carry out the crystalline deposition of thick III-V semiconductor layers on a silicon substrate without the occurrence of unfavorable lattice distortions. To this end, the invention provides that a thin intermediate layer is deposited at a reduced growth temperature between two III-V layers.

18 Claims, 1 Drawing Sheet

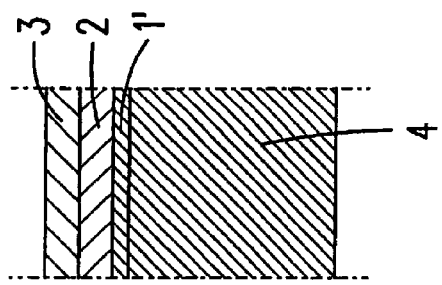
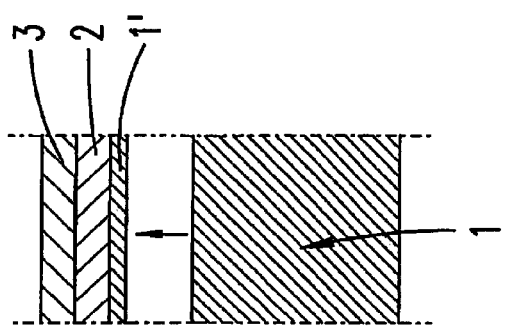
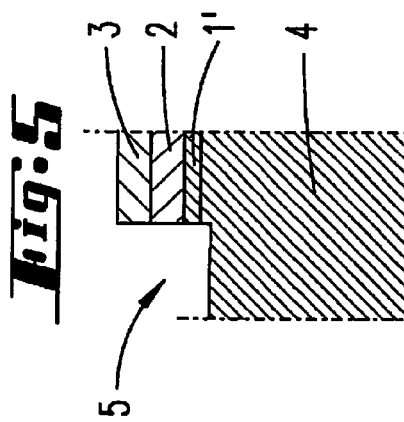
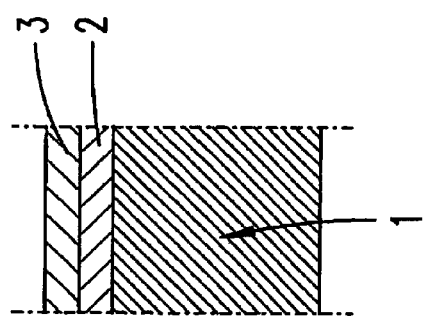
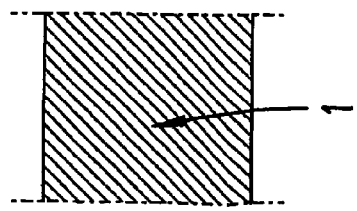

METHOD FOR DEPOSITING III-V SEMICONDUCTOR LAYERS ON A NON-III-V SUBSTRATE

This application is a continuation of pending International Patent Application No. PCT/EP02/12869 filed Nov. 16, 2002 which designates the United States and claims priority of pending German Patent Application Nos. 101 63 718.7 filed Dec. 21, 2001, 102 06 753.8 filed Feb. 19, 2002 and 102 19 223.5 filed Apr. 30, 2002.

The invention relates to a method for depositing III-V semiconductor layers, for example gallium arsenide, aluminum arsenide, aluminum arsenide, gallium indium arsenide or gallium indium aluminum arsenide phosphide on a non-III-V substrate, for example silicon, by introducing gaseous starting substances into the process chamber of a reactor.

According to the invention, the deposition of the III-V layers is effected using the MOCVD method, in which, by way of example, TMG, TMI, TMAI, arsine, phosphine or $NH_3$ are introduced as starting substances into the heated process chamber of a reactor, where a substrate made from silicon is located on a substrate holder that has been heated to process temperature. Unlike when gallium arsenide is being deposited on gallium arsenide or indium phosphide is being deposited on indium phosphide, mismatches occur when III-V layers are being deposited on silicon substrates. As a corollary effect, the grown layers have high defect densities.

On the other hand, silicon substrates have the advantage of being less expensive than III-V substrates and also of being suitable for integration in silicon component structures. One possible way of improving the layer quality is to deposit thick semiconductor layers. However, this is limited by the thermal mismatch of the layers. These thermal mismatches lead to lattice stresses and highly stressed layer sequences. This can give rise to cracks in the layers or to mechanical bending.

A further problem is the combination of III-V layer structures or electronic components fabricated from such layer structures with silicon components on a substrate. In particular, it is desirable to combine optoelectronic III-V components with CMOS components on one substrate.

The invention is based firstly on the object of depositing thick III-V semiconductor layers in crystalline form on a silicon substrate without the disadvantageous lattice stresses occurring.

Furthermore, the invention is based on the object of combining III-V components with silicon components on one substrate.

The object is achieved by the invention given in the claims; Claim 1 firstly and substantially involves a thin interlayer being deposited between two III-V layers at a reduced growth temperature. The reduced growth temperature for the interlayer should as far as possible be at least 100° C. below the growth temperature for the III-V layers. Furthermore, there is provision for the lattice constant of the interlayer preferably to be lower than the lattice constant of the III-V layers. In a preferred refinement of the invention, there is provision for a multiplicity of interlayers to be deposited, in each case separated by a III-V layer. Therefore, thin interlayers are deposited a number of times, in each case on a III-V layer. The interlayer is preferably deposited in unstressed form. The interlayer may contain boron or silicon. The thickness of the interlayer is in the nanometer range. The III-V layers deposited between the interlayers may be considerably thicker. They may be a few micrometers thick. It is preferable for a seed layer, which may likewise consist of a III-V material, to be present between the silicon substrate and a first III-V layer. The III-V layer grows in pseudomorphic form on the interlayer deposited at low temperatures. This leads to stresses. It is preferable to achieve a compressive prestress. The compressive prestress is achieved by means of the low-temperature interlayer.

The method according to the invention allows the growth of substantially unstressed III-V semiconductor layers in the (Al, Ga, In) (As, PN, Sb) system through the growth of low-temperature layers between III-V layers, with the low temperature always being a temperature that is significantly, i.e. at least 100° C., below the standard growth temperature. The tensile stressing during cooling gives rise to the preferred compressive stressing. In the case of an indium phosphide system, this can be effected by means of a GaAs, AlAs, AlInAs or GaInAlAsPN low-temperature layer. Aluminum arsenide, boron aluminum arsenide and also boron arsenide are suitable for use as compressively stressing low-temperature layer in the gallium arsenide system. However, it is also possible to switch to materials belonging to the nitride system.

The repeated deposition of low-temperature interlayers of this type makes it possible to constantly reduce the thermal stressing, but also the stressing induced by the lattice mismatch, to such an extent that it is possible to deposit layers of any desired thickness which are then overall substantially unstressed.

The second objective referred to in the introduction is achieved by virtue of the fact that firstly a III-V semiconductor layer is deposited on a non-III-V substrate, in particular on a silicon substrate, by introducing gaseous starting substances into the process chamber of a reactor. This III-V semiconductor layer is deposited on a first substrate, which has an orientation that is optimized for the deposition of the III-V layer. A silicon substrate with a (111) orientation is particularly suitable for the deposition of a GaN layer. In a subsequent step, this semiconductor layer, together with a thin film of the first substrate, is detached from the substrate. The thickness of the film that is also detached is, for example, 50 μm. In a further process step, the detached layer, together with the thin film of the first substrate, is applied to a second substrate. This second substrate may be a silicon substrate with a (100) orientation. Application of the detached layer is preferably effected by adhesive bonding. This adhesive bonding may be followed by a masking step. According to the invention, there is provision for lateral regions of the applied layer to be removed down into the region of the second substrate. This removal is preferably effected by etching. Then, a layer sequence is applied to the (100) silicon crystal that then forms the surface by means of silicon technology. These layers, which are located adjacent to the III-V layer structures, may be insulation layers, electrically conductive layers or p- or n-doped silicon layers. The deposited III-V layer is preferably a gallium nitride layer.

In a first exemplary embodiment of the invention, first of all a seed layer of gallium arsenide is deposited on a silicon substrate. A buffer layer of gallium arsenide is deposited on this seed layer at the typical growth temperatures for the deposition of high-quality gallium arsenide layers using the MOCVD or VPE method or MBE that are known from the literature. Then, a low-temperature interlayer is deposited on this first III-V layer. For this purpose, the temperature inside the process chamber, i.e. the substrate temperature, is reduced by at least 100° C. Then, the gases required for the growth of the interlayer are introduced into the process chamber. These gases may be trimethylaluminum and arsine or a boron compound. The interlayer is deposited at this reduced temperature until the desired layer thickness, which is between 5 and 50 nm, is reached. It is preferable for the layer thickness to be between 10 and 20 nm.

After the low-temperature interlayer has been deposited, the temperature inside the process chamber is raised again. This is effected by suitable heating of the substrate holder. Then, a further gallium arsenide layer is deposited in pseudomorphic form on the low-temperature interlayer. This gallium arsenide layer is considerably thicker than the low-temperature interlayer. Its thickness may amount to a few μm.

To achieve particularly thick buffer layers, it is possible for a further low-temperature interlayer, which likewise have a lower lattice constant than gallium arsenide, to be deposited on the gallium arsenide layer described above. Gallium arsenide can then be deposited once again on this interlayer. Overall, the method leads to a thick gallium arsenide layer with few dislocations.

BRIEF DESCRIPTION OF DRAWINGS

The method for applying III-V layers in lateral proximity to IV structures is explained in a second exemplary embodiment. In the drawing:

FIG. 1 diagrammatically depicts in cross section a first substrate having a (111) crystal orientation that is optimized for the deposition of a III-V layer, FIG. 2 shows the substrate with III-V layers deposited thereon, FIG. 3 shows the substrate with the III-V layer structure, and also a thin film of the first substrate, detached from it, FIG. 4 shows the previously detached layer structure applied to a second substrate, and FIG. 5 shows an illustration corresponding to FIG. 4 after lateral patterning by etching.

DETAILED DESCRIPTION OF DRAWINGS

FIG. 1 shows regions of a (111) silicon substrate in cross section. In the exemplary embodiment, two III-V layers 2, 3 are deposited on this silicon substrate (cf. FIG. 2). These layers 2, 3 may be gallium arsenide, gallium nitride, indium phosphide or any other desired III-V composition.

This layer sequence 2, 3 is detached together with a thin film 1' of the first substrate 1. The detached layer system 1', 2, 3 is then adhesively bonded to a second substrate (cf. FIG. 4). The second substrate is preferably a (100) silicon substrate. The (100) silicon surface is optimized for the deposition of further, in particular silicon layers. In particular, this surface orientation is optimized for the deposition of CMOS structures.

To dispose structures of this type adjacent to III-V layers, the intermediate product illustrated in FIG. 4 is laterally patterned, which can be effected, for example, by masking. Then, the adhesively bonded layer sequence 1', 2, 3 is etched away. This layer sequence is removed down into the second substrate 4, so that the uncovered surface in this etched-away region 5 is a (100) silicon surface on which CMOS structures can be deposited.

All features disclosed are (inherently) pertinent to the invention. The disclosure content of the associated/appended priority documents (copy of the prior application) is hereby incorporated in its entirety into the disclosure of the application, partly with a view to incorporating features of these documents in claims of the present application.

What is claimed is:

1. Method for applying III-V semiconductor layers to a non-III-V substrate, in particular a silicon substrate, by introducing gaseous starting substances into the process chamber of a reactor, the III-V layers being deposited on the surface of a first substrate having an orientation that is optimized for the deposition of the III-V layers, in particular a silicon substrate, characterized in that the layers are detached together with a thin film of the first substrate, the detached layers together with the thin film of the first substrate are applied to a second substrate, in particular to a silicon substrate, and lateral regions of the applied layers are removed down into the second substrate, if appropriate after a masking step.

2. Method according to claim 1, characterized in that a thin interlayer is deposited between two III-V layers at a reduced growth temperature.

3. Method according to claim 2, characterized in that the growth temperature of the interlayer is at least 100° C. lower than the growth temperature of the III-V layers.

4. Method according to claim 3, characterized in that the lattice constant of the interlayer is lower than the lattice constant of the III-V layers.

5. Method according to claim 4, characterized in that a thin low-temperature interlayer is deposited a number of times, in each case on a III-V layer.

6. Method according to claim 5, characterized in that the interlayer is deposited in unstressed form.

7. Method according to claim 6, characterized in that the interlayer contains boron.

8. Method according to claim 7, characterized in that the interlayer contains nitrogen.

9. Method according to claim 8, characterized in that the thickness of the interlayer is from 5–50 nm, preferably 10–20 nm.

10. Method according to claim 9, characterized in that the coating method used is MOCVD, VPE or MBE.

11. Method according to claim 10, characterized in that the thin interlayer is deposited in situ immediately after the first III-V layer and immediately before the second III-V layer.

12. Method according to claim 11, characterized in that the III-V layers and the thin interlayer are deposited successively in two or more processes.

13. Method according to claim 12, characterized in that component layer sequences are deposited on the thick III-V semiconductor layer.

14. Method according to claim 13, characterized in that the layers that have been detached together with the thin film of the first substrate are adhesively bonded onto the second substrate.

15. Method according to claim 14, characterized in that the III-V layers are a gallium nitride, gallium arsenide or indium phosphide layers.

16. Method according to claim 15, characterized in that those regions of the second substrate from which the applied layer sequence has been removed are coated with an insulation layer, an electrically conductive layer and/or a p- or n-doped layer.

17. Method according to claim 16, characterized in that CMOS structures are applied to the uncovered surface sections of the second substrate.

18. Method according to claim 17, characterized in that components are fabricated from the component layer sequences.

* * * * *